US011528557B2

(12) United States Patent
Ishizuka

(10) Patent No.: US 11,528,557 B2
(45) Date of Patent: Dec. 13, 2022

(54) METHOD AND DEVICE FOR CONTROLLING FIR FILTER

(71) Applicant: Yamaha Corporation, Shizuoka (JP)

(72) Inventor: Kenji Ishizuka, Shizuoka (JP)

(73) Assignee: YAMAHA CORPORATION, Shizuoka (JP)

( * ) Notice: Subject to any disclaimer, the term of this patent is extended or adjusted under 35 U.S.C. 154(b) by 0 days.

(21) Appl. No.: 17/480,932

(22) Filed: Sep. 21, 2021

(65) Prior Publication Data

US 2022/0095048 A1 Mar. 24, 2022

(30) Foreign Application Priority Data

Sep. 23, 2020 (JP) .............................. JP2020-158810

(51) Int. Cl.
*H04R 3/04* (2006.01)
*H03H 17/06* (2006.01)
*H03H 17/00* (2006.01)

(52) U.S. Cl.
CPC .............. *H04R 3/04* (2013.01); *H03H 17/06* (2013.01); *H03H 2017/0081* (2013.01)

(58) Field of Classification Search
CPC . H04R 3/04; H03G 5/02; H03H 17/00; H03H 17/02; H03H 17/06; H03H 2017/0081
USPC ............................ 381/98; 708/306, 319, 322
See application file for complete search history.

(56) References Cited

U.S. PATENT DOCUMENTS

| | | | | |
|---|---|---|---|---|
| 11,139,800 B1* | 10/2021 | Weiss | ................. | H03H 17/0255 |
| 11,228,836 B2* | 1/2022 | Ishizuka | ................. | H03H 17/02 |
| 2006/0233392 A1* | 10/2006 | Koyanagi | .............. | H03H 17/06 381/98 |
| 2007/0053420 A1* | 3/2007 | Koyanagi | .............. | H03H 17/06 375/232 |

FOREIGN PATENT DOCUMENTS

WO   WO 2021/137043   *   7/2021   ............. H03H 17/06

OTHER PUBLICATIONS

Wikipedia, "Butterworth filter," Searched on Jul. 1, 2020, https://en.wikipedia.org/wiki/Butterworth_filter.

* cited by examiner

*Primary Examiner* — Xu Mei
(74) *Attorney, Agent, or Firm* — Global IP Counselors, LLP

(57) ABSTRACT

A method for controlling an FIR filter includes generating, based on operation information, a first and second control data, generating a second amplitude characteristic, and setting filter coefficients of the FIR filter based on the second amplitude characteristic. The first control data indicates an amount of expansion/compression in a frequency axis direction of a first amplitude characteristic that corresponds to a predetermined transfer function that is expressed as a function of an angular frequency, and the amount of expansion/compression is an integer value or a non-integer value. The second control data indicates an amount of shift in the frequency axis direction of the first amplitude characteristic. The second amplitude characteristic is generated by expanding/compressing the first amplitude characteristic in the frequency axis direction in accordance with the first control data and shifting the first amplitude characteristic in the frequency axis direction in accordance with the second control data.

10 Claims, 3 Drawing Sheets

METHOD AND DEVICE FOR CONTROLLING FIR FILTER

CROSS-REFERENCE TO RELATED APPLICATIONS

This application claims priority to Japanese Patent Application No. 2020-158810, filed on Sep. 23, 2020. The entire disclosure of Japanese Patent Application No. 2020-158810 is hereby incorporated herein by reference.

BACKGROUND

Technical Field

The present invention relates to a method and device for controlling an FIR filter.

Background Information

IIR (Infinite Impulse Response) filters are used in various fields due to their small size. For example, Wikipedia, "Butterworth filter," [Searched on Jul. 1, 2020], the Internet <URL: https://en.wikipedia.org/wiki/Butterworth_filter> discloses a Butterworth filter, one example of an IIR filter.

SUMMARY

IR filters that simulate analog filters have a relatively small configuration, but are inherently limited in the adjustment of their amplitude characteristics. For example, in the case of IIR filters, since the degree n of the transfer function is limited to an integer, the angle of inclination of the slope portion of the amplitude characteristic (amplitude frequency response) can be controlled only by adjusting the degree n of the transfer function in discrete values. It is conceivable to more finely adjust the angle of inclination of the slope portion of the amplitude characteristic using the sharpness Q of the amplitude characteristic and the degree n of the transfer function of the IR filter, but the shape of the amplitude characteristic in that case changes in a different manner compared to the case in which the angle of inclination is adjusted using only the degree n with the sharpness Q fixed, so that it is not possible to maintain the continuity of the amplitude characteristic between HR filters of different degree.

Given the circumstances described above, an object of this disclosure is to provide a technical means for finely and continuously adjusting the angle of inclination of the slope portion of the amplitude characteristic that is compatible with IIR filters and analog filters.

This disclosure provides a method for controlling an FIR filter that processes sound signals. The method comprises generating, based on operation information provided by a user, a first control data and a second control data. The first control data indicates an amount of expansion and/or compression in the frequency axis direction of a prescribed first amplitude characteristic that corresponds to a predetermined transfer function that is expressed as a function of an angular frequency, and the amount of expansion and/or compression is an integer value or a non-integer value. The second control data indicates an amount of shift in the frequency axis direction of the first amplitude characteristic. The method further comprises generating a second amplitude characteristic by expanding and/or compressing the first amplitude characteristic in the frequency axis direction in accordance with the first control data and by shifting the first amplitude characteristic in the frequency axis direction in accordance with the second control data, and setting filter coefficients of the FIR filter based on the second amplitude characteristic.

Further, this disclosure provides a device for controlling an FIR filter that processes sound signals. The device comprises an interface and one or more processors. The interface is configured to receive operation information from a user. The one or more processors are configured to generate, based on the operation information, a first control data and a second control data. The first control data indicates an amount of expansion and/or contraction in the frequency axis direction of a prescribed first amplitude characteristic that corresponds to a predetermined transfer function that is expressed as a function of an angular frequency, and the amount of expansion and/or compression is an integer value or a non-integer value. The second control data indicates an amount of shift in the frequency axis direction of the first amplitude characteristic. The one or more processors are further configured to generate a second amplitude characteristic by expanding and/or compressing the first amplitude characteristic in the frequency axis direction in accordance with the first control data, and by shifting the first amplitude characteristic in the frequency axis direction in accordance with the second control data. The one or more processors are further configured to set filter coefficients of the FIR filter based on the second amplitude characteristic.

DETAILED DESCRIPTION OF THE EMBODIMENTS

Selected embodiments will now be explained with reference to the drawings. It will be apparent to those skilled in the field from this disclosure that the following descriptions of the embodiments are provided for illustration only and not for the purpose of limiting the invention as defined by the appended claims and their equivalents.

Figure 1:
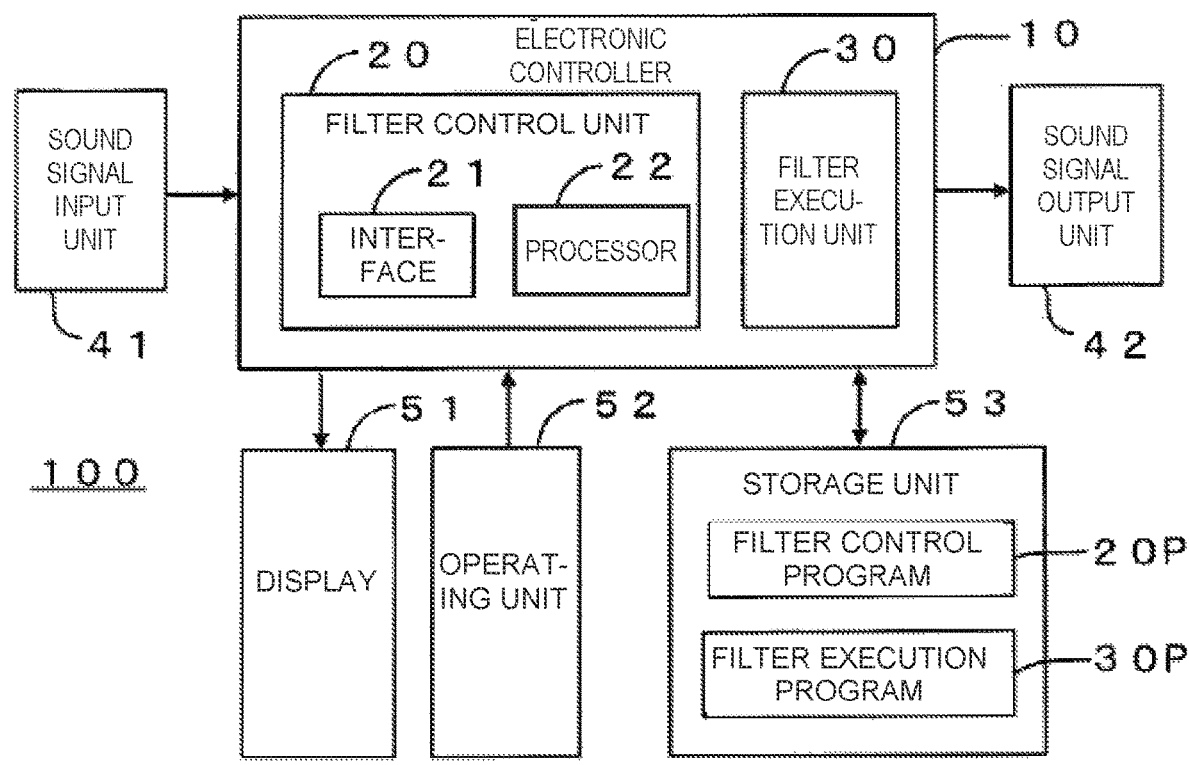
FIG. 1 is a block diagram showing a configuration of a signal processing device according to an embodiment of this disclosure.

FIG. 1 is a block diagram showing the configuration of a signal processing device 100 according to an embodiment of this disclosure. As shown in FIG. 1, the signal processing device 100 comprises an electronic controller 10, a sound signal input unit 41, a sound signal output unit 42, a display 51, an operating unit 52, and a storage unit 53.

The electronic controller 10 is a control center that controls the entire signal processing device 100. The term "electronic controller" as used herein refers to hardware that executes software programs. The electronic controller 10 includes an interface, and at least one processor such as a CPU (Central Processing Unit). The electronic controller 10 can be configured to comprise, instead of the CPU or in addition to the CPU, programmable logic devices such as a DSP (Digital Signal Processor), an FPGA (Field Programmable Gate Array), and the like. In addition, the electronic controller 10 can include a plurality of CPUs (or a plurality of programmable logic devices). The sound signal input unit 41 is a device that receives sound signals from an external device (not shown) such as a tuner, an audio reproduction device, or the like, and supplies the sound signals to the electronic controller 10. The sound signal output unit 42 is a device that supplies sound signals output from the electronic controller 10 to a not-shown external device such as a speaker and causes the external device to emit sound. The display (display unit) 51 is a device that provides various display information to the user, and includes a liquid-crystal display panel, an organic electroluminescent display, or the like. The operating unit (user operable input) 52 is operated by the user for providing various data and instructions to the electronic controller 10, and includes various operators such as a keyboard or a mouse. The display 51 and the operating unit 52 can be a touch panel that combines their respective functions. The storage unit (computer memory) 53 is any computer storage device or any non-transitory computer-readable medium with the sole exception of a transitory, propagating signal. For example, the storage unit 53 can include nonvolatile memory and volatile memory, and can includes a ROM (Read Only Memory) device, a RAM (Random Access Memory) device, a hard disk, a flash drive, etc. The storage unit 53 is configured to store settings, programs, data, calculations and/or results of the processor(s) of the electronic controller 10. In this embodiment, the storage unit is formed of a volatile storage section such as a RAM and a non-volatile storage section such as a ROM or an HD (Hard Disk). The volatile storage section is used as a work area by the electronic controller 10. The non-volatile storage section contains various programs and fixed control data. Programs stored in the non-volatile storage section include a filter control program 20P which causes the electronic controller 10 to function as a filter control unit 20, and a filter execution program 30P that causes the electronic controller 10 to function as a filter execution unit 30.

The electronic controller 10 executes a plurality of units including the filter control unit 20 and the filter execution unit 30 to realize the functions. The filter execution unit 30 takes in, from the sound signal input unit 41, samples of the sound signal to be processed, and convolves a prescribed number of filter coefficients stored in the volatile storage section of the storage unit 53 for a prescribed number of previously taken in samples, and then, from the sound signal output unit 42, outputs the samples resulting from the convolution operation. That is, the filter execution unit 30 functions as an FIR (Finite Impulse Response) filter that processes the input sound signal and outputs a sound signal for which a frequency response corresponding to the filter coefficients has been added.

The filter control unit 20 generates filter coefficients to be used by the filter execution unit 30 for the convolution operation and stores the filter coefficients in the volatile storage section of the storage unit 53. The filter control unit 20 has an interface (input unit) 21 and a processor (processing unit) 22.

The interface 21 receives operation information from the user. In the present embodiment, the processor 22 is formed of one processor. However, the processor 22 can be formed of a plurality of processors. The processor 22 generates, based on the operation information, a first control data, which indicates an amount of expansion and/or compression in the frequency axis direction of a prescribed first amplitude characteristic that corresponds to a predetermined transfer function that is expressed as a function of an angular frequency and indicates the amount of expansion and/or compression that can take on a non-integer value (i.e., the amount of expansion and/or compression is an integer value or a non-integer value), and a second control data which indicates an amount of shift in the frequency axis direction of the first amplitude characteristic. The processor 22 further generates a second amplitude characteristic by expanding and/or compressing the first amplitude characteristic in the frequency axis direction in accordance with the first control data and by shifting the first amplitude characteristic in the frequency axis direction in accordance with the second control data, and sets the filter coefficients of the FIR filter executed by the filter execution unit 30 based on the second amplitude characteristic.

More specifically, it is as follows. Equation (1) shows the general transfer function H ($\omega$) expressed as a function of an angular frequency $\omega$ and corresponding to the frequency response of an IIR filter or an analog filter.

$$H(\omega) = \{b_0 + b_1(j\omega) + b_2(j\omega)^2 + \ldots + b_N(j\omega)^N\}/\{a_0 + a_1(j\omega) + a_2(j\omega)^2 + \ldots + a_M(j\omega)^M\} \quad (1)$$

As shown in Equation (2) below, the processor 22 replaces the degree n of the angular frequency $\omega$ of the transfer function H($\omega$) corresponding to the first amplitude characteristic with a virtual degree n'=n·c, which reflects the amount of expansion and/or compression in the frequency axis direction indicated by the first control data c, and replaces the angular frequency $\omega$ with a virtual angular frequency $\omega'=\omega/\omega 0$, which reflects the amount of shift in the frequency axis direction indicated by the second control data $\omega 0$, to generate the transfer function H'($\omega$).

$$H'(\omega) = \{b_0 + b_1(j\omega/\omega 0)^c + b_2(j\omega/\omega 0)^{2 \cdot c} + \ldots + b_N(j\omega/\omega 0)^{N \cdot c}\}/\{a_0 + a_1(j\omega/\omega 0)^c + a_2(j\omega/\omega 0)^{2 \cdot c} + \ldots + a_M(j\omega/\omega 0)^{M \cdot c}\} \quad (2)$$

From the transfer function H'($\omega$) calculated based on the virtual degree and the virtual angular frequency, the processor 22 then generates a second amplitude characteristic corresponding to the first control data c and the second control data $\omega 0$. The second amplitude characteristic is an amplitude characteristic in which the first amplitude characteristic corresponding to the transfer function H($\omega$) is expanded and/or compressed by an expansion and/or compression amount c, and shifted by a shift amount $\omega o$ in the angular frequency axis direction.

In a preferred embodiment, the transfer function is the transfer function of a filter that has a first amplitude characteristic that includes the slope portion. The interface 21 displays a screen relating to the first amplitude characteristic on the display 51, and receives from the user, as the operation information, via the operating unit 52, first operation information that specifies the angle of inclination of the slope portion of the first amplitude characteristic, and second operation information that specifies the location of the slope portion on the frequency axis. The processor 22 generates the first control data from the first operation information and the second control data from the second operation information.

The processor 22 then generates the second amplitude characteristic based on the transfer function, the first control data, and the second control data, generates the filter coefficients of the FIR filter based on the second amplitude characteristic, and stores the filter coefficients in the volatile storage section of the storage unit 53.

The foregoing is an explanation of the configuration of the signal processing device 100 according to the present embodiment.

Figure 2:
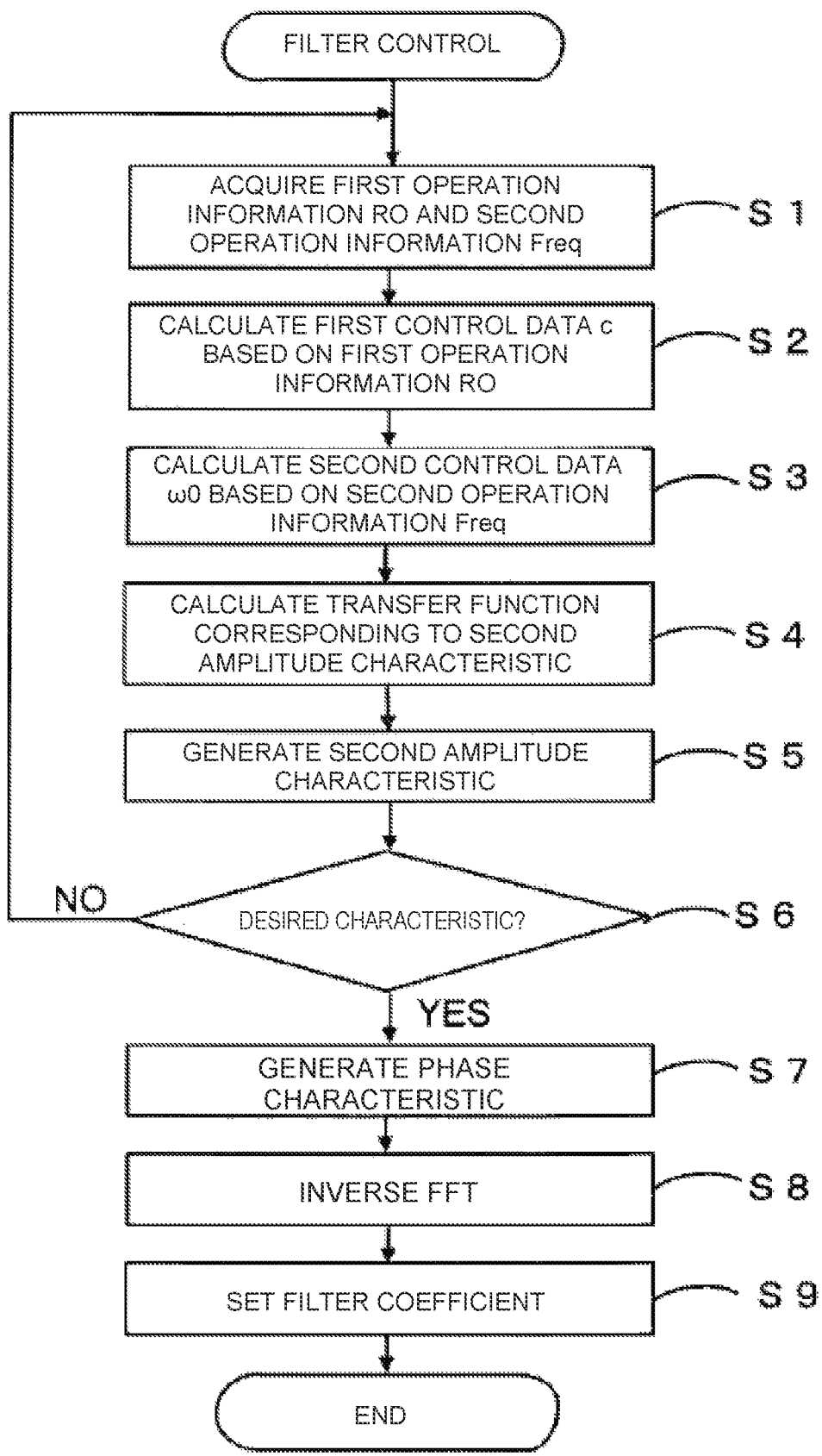
FIG. 2 is a flowchart showing an operation of the embodiment.

The operation of the present embodiment will now be described. FIG. 2 is a flowchart showing an example of an operation of the filter control unit 20 according to the present embodiment.

In the present embodiment, when the filter control program 20P is activated by an operation of the operating unit 52, the electronic controller 10 functions as the filter control unit 20. The interface 21 of the filter control unit 20 receives as the operation information from the user via the operating unit 52, first operation information RO that specifies the angle of inclination of the slope portion of the first amplitude characteristic, and second operation information Freq that specifies the location of the slope portion on the frequency axis (Step S1). In a preferred embodiment, in this Step S1, the interface 21 causes the user to select a desired filter type, displays on the display 51 the first amplitude characteristic obtained from the transfer function (the predetermined transfer function) corresponding to the desired filter type selected by the user, and acquires the first operation information RO and the second operation information Freq. As explained in more detail later, selection of the desired filter type by the user substantially corresponds to selection of the predetermined transfer function by the user.

The processor 22 of the filter control unit 20 then calculates the first control data c from the first operation information RO (Step S2). The first control data c can take on non-integer values. In other words, the first control data c is an integer value or a non-integer value. The processor 22 then calculates the second control data ω0 from the second operation information Freq (Step S3).

The processor 22 then calculates a transfer function that corresponds to the second amplitude characteristic based on the first control data c and the second control data ω0 (Step S4). Next, the processor 22 generates the second amplitude characteristic from the transfer function calculated in Step S4 (Step S5).

The processor 22 then displays the second amplitude characteristic on the display 51, and the user determines whether the second amplitude characteristic is the desired characteristic (Step S6). If the second amplitude characteristic is not the desired characteristic, the user can request to re-enter the first operation information RO or the second operation information Freq by operation of the operating unit 52. When there is a re-input request, the determination result of Step S6 becomes "NO," and the processor 22 returns to the process of Step S1.

When the determination result of Step S6 becomes "YES," the processor 22 generates the phase characteristic from the second amplitude characteristic. In the present embodiment, the processor 22 generates the minimum phase characteristic as this phase characteristic.

Next, the processor 22 applies an inverse FFT (Fast Fourier Transform) to the second amplitude characteristic and the phase characteristic, and generates an impulse response waveform of the FIR filter (Step S8). The processor 22 then samples the impulse response waveform in order to generate the filter coefficients of the FIR filter and stores the filter coefficients in the volatile storage section of the storage unit 53 (Step S9). The filter execution unit 30 utilizes the filter coefficients stored in the storage unit 53 in this manner and functions as an FIR filter.

Figure 3:
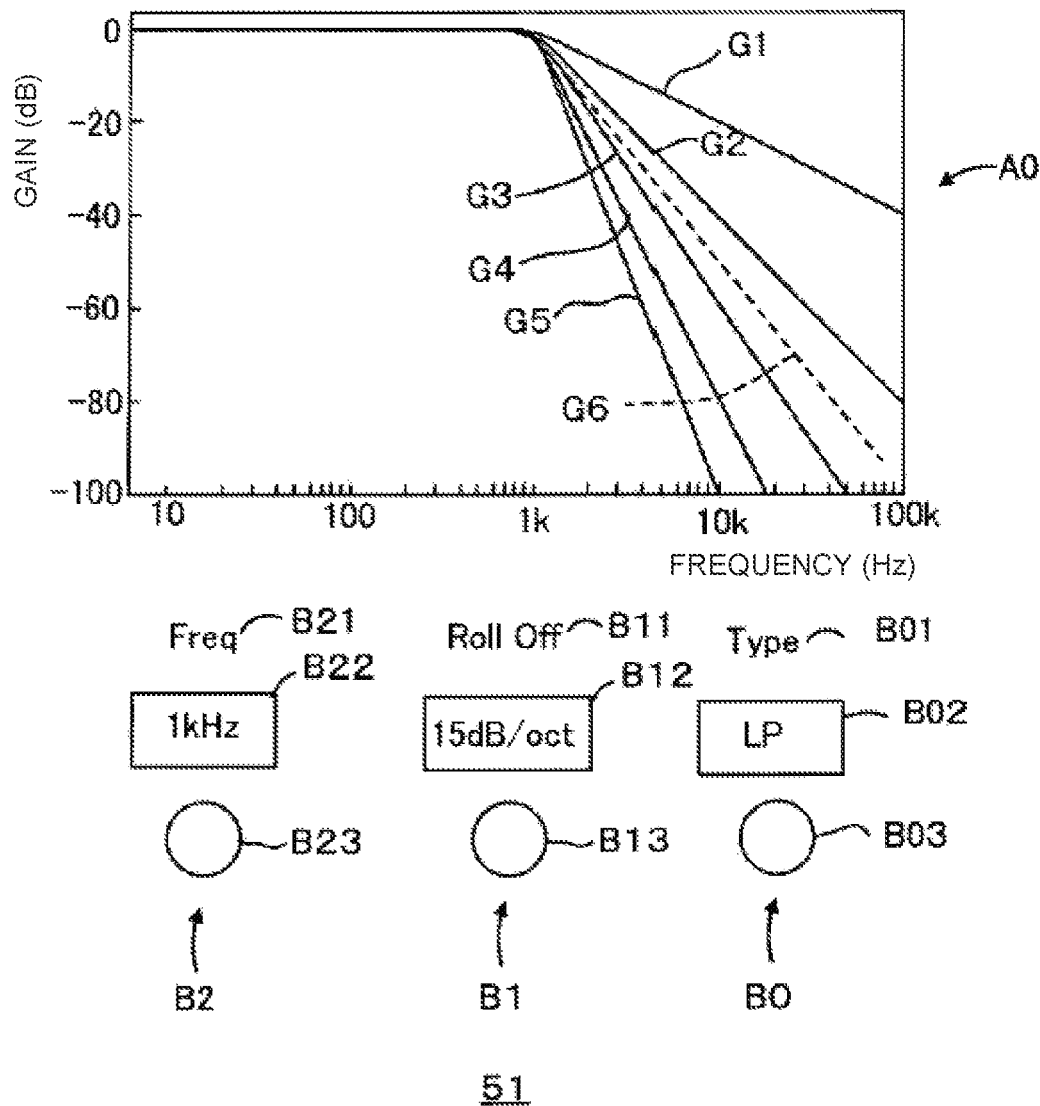
FIG. 3 is a diagram showing a display example of a display of the signal processing device.

FIG. 3 is a diagram showing a display example of the display 51 in the operation example described above. As illustrated in FIG. 3, a characteristic display area A0 for displaying the second amplitude characteristic is provided in the upper region of the display screen of the display 51. The second amplitude characteristic shown here has frequency on the horizontal axis and the gain on the vertical axis.

In the display screen of the display 51, three types of instruction areas B0, B1, and B2 are provided in the lower region of the characteristic display area A0.

In the instruction area B0 on the right, characters B01 Type, meaning the filter type, are displayed in the upper region, a window B02 indicating the type of the currently selected filter is displayed in the center region, and an instruction button B03 is displayed in the lower region. In the present embodiment, the transfer functions for a plurality of filter types are stored in the storage unit 53, and the second amplitude characteristic can be generated for any filter from the plurality of filter types. Any of the transfer functions corresponds to the predetermined transfer function. The user can operate the instruction button B03 by a pointing device of the operating unit 52 and change the type of filter displayed in the window B02, that is, the filter, by operating the arrow keys of a keyboard, or the like, thereby selecting the desired filter type, i.e., the predetermined transfer function. In the example shown in FIG. 3, the characters LP are displayed in the window B02, which indicates that a Butterworth low-pass filter has been selected.

In the central instruction area B1, characters B11 RollOff, i.e., the slope portion of the amplitude characteristic, are displayed in the upper region, a window B12 indicating the currently selected first operation information RO is displayed in the central region, and an instruction button B13 is displayed in the lower region. In the present embodiment, any first operation information RO can be selected from among a plurality of types of first operation information RO. The user can operate the instruction button B13 by a pointing device of the operating unit 52 and change the first operation information RO displayed in the window B12 by operating the arrow keys of a keyboard, or the like, thereby selecting roll-off of the selected filter, i.e., inclination of the slope portion. In the example shown in FIG. 3, 15 dB/octave is selected as the first operation information RO that specifies the angle of inclination of the slope portion. In the case of an ordinary Butterworth low-pass filter, it is possible to specify only discrete angles of inclination, such as 20 ndB/oct (where n is an integer). However, in the present embodiment, it is possible to specify any angle of inclination besides discrete values.

In the instruction area B2 on the left, characters B21 Freq are displayed in the upper region, a window B22 indicating the second operation information Freq that specifies the location of the slope portion on the frequency axis is displayed in the center region, and an instruction button B23 is displayed in the lower region. In the present embodiment, any second operation information Freq can be selected from among a plurality of types of second operation information Freq. The user can operate the instruction button B23 by a pointing device of the operating unit 52 and change the second operation information Freq displayed in the window B22 by operating the arrow keys of a keyboard, etc., thereby selecting a cut-off frequency, i.e., a frequency at which the slope portion starts. In the example shown in FIG. 3, 1 kHz is selected as the second operation information Freq.

Here, as shown in FIG. 3, a process for generating the second amplitude characteristic will be specifically described for the example case of a low-pass Butterworth type filter.

When a low-pass Butterworth filter is selected, the transfer function (the predetermined transfer function) specified by the equation below is used to generate the second amplitude characteristic.

$$H1pf(\omega) = 1/(1+\omega^{2n}) \quad (3)$$

In Step S2 described above, the first control data c is calculated from the first operation information RO in accordance with the equation below.

$$c=RO/(10\log_{10}2) \quad (4)$$

Next, in Step S3, the second control data ω0 is calculated from the second operation information Freq in accordance with the equation below.

$$\omega 0=2\pi\mathrm{Freq} \quad (5)$$

Next, in Step S4, the degree n of the angular frequency ω in the transfer function H1pf(ω) of equation (3) above is replaced with a virtual degree n·c, which reflects the amount of expansion and/or compression in the frequency axis direction indicated by the first control data c, and the angular frequency ω is replaced with a virtual angular frequency ω/ω0, which reflects the amount of shift in the frequency axis direction indicated by the second control data ω0, in order to calculate a transfer function H'1pf (ω) indicated by the equation below.

$$H'1pf(\omega)=1/(1+(\omega/\omega 0)^{2c}) \quad (6)$$

In Step S5, the second amplitude characteristic is generated based on the transfer function H'1pf(ω) obtained in this manner.

FIG. 3 shows various types of second amplitude characteristics displayed in the characteristic display area A0 in Step S6 when the second operation information Freq is set to 1 kHz and the first operation information RO is varied. More specifically, FIG. 3 shows various cases in which 20 ndB/oct is selected as the first operation information RO, namely, a second amplitude characteristic G1 when 20 dB/oct is selected, a second amplitude characteristic G2 when 40 dB/oct is selected, a second amplitude characteristic G3 when 60 dB/oct is selected, a second amplitude characteristic G4 when 80 dB/oct is selected, and a second amplitude characteristic G5 when 100 dB/oct is selected. FIG. 3 also shows a second amplitude characteristic G6 when an inclination that does not correspond to 20 ndB/oct is selected as the first operation information RO, that is, when 50 dB/oct is selected.

Since the second operation information Freq is set to 1 kHz, the starting positions of the slope portions of the second amplitude characteristics G1-G6, that is, the frequencies at which the gain starts to decrease, are all in the vicinity of 1 kHz.

The first operation information RO, which indicates the angles of inclination of the slope portions of the second amplitude characteristics G1-G5 are discrete values represented by 20 ndB/oct. Here, the first control data c obtained from the first operation information RO has an integer value of n equal to 1, 2, 3, 4, and 5. The angle of inclination of this slope portion is an angle of inclination that can be realized by an ordinary Butterworth low-pass filter.

In regard to the second amplitude characteristic G6, the first operation information RO indicates 50 dB/oct, and the first control data c obtained from this first operation information RO=50 dB/oct is a non-integer value. The angle of inclination of the slope portion is an angle of inclination that cannot be realized by an ordinary Butterworth low-pass filter.

However, in the present embodiment, the transfer function H'1pf(ω) of the aforementioned equation (6) is calculated using the non-integer first control data c obtained from the first operation information RO=50 dB/oct, and the filter coefficients of the FIR filter are set based on the second amplitude characteristic G6 obtained from the transfer function H'1pf(ω). Thus, by the present embodiment, the FIR filter can realize an amplitude characteristic that has an angle of inclination of the slope portion that cannot be realized by an ordinary Butterworth low-pass filter.

As described above, by the present embodiment, it is possible to easily adjust of the angle of inclination of the slope portion of the amplitude characteristic of the filter. Further, by the present embodiment, it is possible to adjust only the angle of inclination of the slope portion without changing the other shapes of the amplitude characteristic, so that the amplitude characteristic can remain compatible with an existing IIR filter.

One embodiment of this disclosure was described above, but other embodiments of this disclosure are possible. Some examples follow.

(1) In the above-described embodiment, an embodiment in which this disclosure is applied to a Butterworth low-pass filter was explained, but the target of application of this disclosure is not limited thereto, and this disclosure can be applied to a Butterworth high-pass filter, for example.

(2) Further, this disclosure can be applied to a high shelf filter having the transfer function represented by the following equation.

$$H h\mathrm{shelf}(\omega)=\{1+\sqrt{g}(2/Q)j\omega+g(j\omega)^2\}/\{1+(2/Q)j\omega+(j\omega)^2\} \quad (7)$$

In this case, the transfer function corresponding to the second amplitude characteristic is represented by the following equation.

$$H'h\mathrm{shelf}(\omega)=\{1+\sqrt{g}(2/Q)(j\omega/\omega 0)^c+g(j\omega/\omega 0)^{2c}\}/\{1+(2/Q)(j\omega/\omega 0)^c+(j\omega/\omega 0)^{2c}\} \quad (8)$$

The same applies to a low shelf filter.

(3) Further, this disclosure can be applied to peaking filter having the transfer function represented by the following equation.

$$Hpeq(\omega)=\{1+g(1/Q)j\omega+(j\omega)^2\}/\{1+(1/Q)j\omega+(j\omega)^2\} \quad (9)$$

In this case, the transfer function corresponding to the second amplitude characteristic is represented by the following equation.

$$H'peq(\omega)=\{1+g(1/Q)(j\omega/\omega 0)^c+(j\omega/\omega 0)^{2c}\}/\{1+(1/Q)(j\omega/\omega 0)^c+(j\omega/\omega 0)^{2c}\} \quad (10)$$

(4) In this disclosure, the transfer function corresponding to the first amplitude characteristic is not limited to the transfer function of a Butterworth filter. The transfer function of a Butterworth filter, a Chebyshev filter, an Elliptical filter, or a Bessel filter is a suitable transfer function corresponding to the first amplitude characteristic.

(5) In the above-described embodiment, the transfer function corresponding to the second amplitude characteristic is calculated from the transfer function corresponding to the first amplitude characteristic, and the second amplitude characteristic is generated from this calculated transfer function. However, instead, it is also possible to generate the first amplitude characteristic from the transfer function corresponding to the first amplitude characteristic, and this first amplitude characteristic can be transformed based on the first control data c and the second control data ω0 in order to generate the second amplitude characteristic.

What is claimed is:

1. A method for controlling an FIR filter that processes sound signals, the method comprising:
 generating, based on operation information provided by a user,
  a first control data which indicates an amount of expansion and/or compression in a frequency axis direction of a first amplitude characteristic that corresponds to a predetermined transfer function that is expressed as a function of an angular frequency, the amount of expansion and/or compression being an integer value or a non-integer value, and a second control data which indicates an amount of shift in the frequency axis direction of the first amplitude characteristic;

generating a second amplitude characteristic by expanding and/or compressing the first amplitude characteristic in the frequency axis direction in accordance with the first control data and by shifting the first amplitude characteristic in the frequency axis direction in accordance with the second control data; and setting filter coefficients of the FIR filter based on the second amplitude characteristic.

2. The method according to claim 1, wherein
in the generating of the second amplitude characteristic, a degree of the angular frequency in the predetermined transfer function corresponding to the first amplitude characteristic is replaced with a virtual degree which reflects the amount of expansion and/or compression in the frequency axis direction indicated by the first control data, the angular frequency is replaced with a virtual angular frequency which reflects the amount of shift in the frequency axis direction indicated by the second control data, a transfer function is calculated based on the virtual degree and the virtual angular frequency, and the second amplitude characteristic corresponding to the first control data and the second control data is generated from the calculated transfer function.

3. The method according to claim 1, wherein
the predetermined transfer function is a transfer function of a filter having the first amplitude characteristic that includes a slope portion,
the method further comprises receiving, as the operation information, first operation information specifying an angle of inclination of the slope portion of the first amplitude characteristic and second operation information specifying a location of the slope portion on the frequency axis, and
the first control data is generated from the first operation information, and the second control data is generated from the second operation information.

4. The method according to claim 3, wherein
the predetermined transfer function is a transfer function of any one of a Butterworth filter, a Chebyshev filter, an Elliptical filter, and a Bessel filter.

5. The method according to claim 1, further comprising selecting the predetermined transfer function by the user.

6. A device for controlling an FIR filter that processes sound signals, the device comprising:
an interface configured to receive operation information from a user, and
one or more processors configured to
generate, based on the operation information,
a first control data which indicates an amount of expansion and/or compression in a frequency axis direction of a first amplitude characteristic that corresponds to a predetermined transfer function that is expressed as a function of an angular frequency, the amount of expansion and/or compression being an integer value or a non-integer value, and a second control data which indicates an amount of shift in the frequency axis direction of the first amplitude characteristic, generate a second amplitude characteristic by expanding and/or compressing the first amplitude characteristic in the frequency axis direction in accordance with the first control data, and by shifting the first amplitude characteristic in the frequency axis direction in accordance with the second control data, and set filter coefficients of the FIR filter based on the second amplitude characteristic.

7. The device according to claim 6, wherein
the one or more processors are configured to replace a degree of the angular frequency in the predetermined transfer function corresponding to the first amplitude characteristic with a virtual degree which reflects the amount of expansion and/or compression in the frequency axis direction indicated by the first control data, replace the angular frequency with a virtual angular frequency which reflects the amount of shift in the frequency axis direction indicated by the second control data, calculate a transfer function based on the virtual degree and the virtual angular frequency, and generate the second amplitude characteristic corresponding to the first control data and the second control data from the calculated transfer function.

8. The device according to claim 6, wherein
the predetermined transfer function is a transfer function of a filter having the first amplitude characteristic that includes a slope portion,
the interface is further configured to display a screen relating to the first amplitude characteristic on a display, and receive from the user first operation information specifying an angle of inclination of the slope portion of the first amplitude characteristic, and second operation information specifying a location of the slope portion on the frequency axis, and
the one or more processors are configured to generate the first control data from the first operation information, and generate the second control data from the second operation information.

9. The device according to claim 6, wherein
the predetermined transfer function is a transfer function of any one of a Butterworth filter, a Chebyshev filter, an Elliptical filter, and a Bessel filter.

10. The device according to claim 6, wherein
the interface is further configured to cause the user to select the predetermined transfer function.

* * * * *